(12) United States Patent
Stahl et al.

(10) Patent No.: US 10,643,896 B2
(45) Date of Patent: May 5, 2020

(54) METHOD FOR PRODUCING AT LEAST ONE VIA IN A WAFER

(71) Applicant: Robert Bosch GmbH, Stuttgart (DE)

(72) Inventors: Heiko Stahl, Reutlingen (DE); Jochen Reinmuth, Reutlingen (DE); Markus Kuhnke, Wannweil (DE); Stefan Majoni, Weil im Schoenbuch (DE); Timo Schary, Aichtal-Neuenhaus (DE)

(73) Assignee: Robert Bosch GmbH, Stuttgart (DE)

( * ) Notice: Subject to any disclaimer, the term of this patent is extended or adjusted under 35 U.S.C. 154(b) by 57 days.

(21) Appl. No.: 16/135,054

(22) Filed: Sep. 19, 2018

(65) Prior Publication Data

US 2019/0096762 A1 Mar. 28, 2019

(30) Foreign Application Priority Data

Sep. 25, 2017 (DE) ........................ 10 2017 216 937

(51) Int. Cl.
*H01L 21/768* (2006.01)
*H01L 23/48* (2006.01)
*H01L 21/285* (2006.01)

(52) U.S. Cl.
CPC .. *H01L 21/76898* (2013.01); *H01L 21/28568* (2013.01); *H01L 21/76877* (2013.01); *H01L 21/76879* (2013.01); *H01L 23/481* (2013.01)

(58) Field of Classification Search
CPC ....... H01L 21/28506–28531; H01L 21/28568; H01L 21/768; H01L 21/76838; H01L 21/76877; H01L 21/76879; H01L 21/76883; H01L 21/76886; H01L 21/76892; H01L 21/76895; H01L 21/76897; H01L 21/76898; H01L 23/481;
(Continued)

(56) References Cited

U.S. PATENT DOCUMENTS 5,552,340 A * 9/1996 Lee ................... H01L 21/28512
257/E21.162
5,654,234 A * 8/1997 Shih ................... H01L 21/28556
257/E21.17
(Continued)

FOREIGN PATENT DOCUMENTS

DE 10 2011 085 084 A1 4/2013

*Primary Examiner* — Maliheh Malek
(74) *Attorney, Agent, or Firm* — Maginot, Moore & Beck LLP (57) ABSTRACT

A method for producing a via in a wafer includes providing a wafer, comprising silicon. The method includes producing a conductive region, in the form of a conductor track, preferably composed of polycrystalline silicon, in the wafer. The method includes producing a hole in the wafer such that the hole is fluidically connected to the conductive region and the sidewalls of the hole comprise silicon. The method includes applying a tungsten hexafluoride-resistant protective layer, produced from silicon oxide, in the region of the surface of the hole that is to be produced or has been produced, such that an opening of the hole is free of a protective layer. The method includes applying tungsten hexafluoride to the hole and the region of the opening of the hole by a reducing-agent-free vapor phase deposition process, preferably in the form of a CVD process, for producing the via.

17 Claims, 8 Drawing Sheets

(58) Field of Classification Search
CPC ............... H01L 23/5221; H01L 23/535; H01L 23/5384
See application file for complete search history.

(56) References Cited

U.S. PATENT DOCUMENTS

| | | | | |
|---|---|---|---|---|
| 5,700,726 A * | 12/1997 | Huang | ................ | H01L 21/7684 257/E21.583 |
| 5,801,096 A * | 9/1998 | Lee | .................. | H01L 21/32136 257/E21.311 |
| 5,861,671 A * | 1/1999 | Tsai | .................. | H01L 21/76879 257/750 |
| 5,889,328 A * | 3/1999 | Joshi | ................. | H01L 21/76838 257/751 |
| 5,950,099 A * | 9/1999 | Shoda | ............... | H01L 21/28512 257/E21.162 |
| 5,970,374 A * | 10/1999 | Teo | .................... | H01L 21/76843 257/E21.584 |
| 6,093,645 A * | 7/2000 | Ameen | ..................... | C23C 8/02 257/E21.584 |
| 6,245,657 B1 * | 6/2001 | Chu | .................. | H01L 21/76838 257/E21.582 |
| 6,251,726 B1 * | 6/2001 | Huang | .............. | H01L 27/10894 257/E21.013 |
| 6,287,964 B1 * | 9/2001 | Cho | .................. | H01L 21/76877 438/643 |
| 6,294,799 B1 * | 9/2001 | Yamazaki | ........... | H01L 23/5222 257/72 |
| 6,309,966 B1 * | 10/2001 | Govindarajan | ... | H01L 21/28556 257/E21.168 |
| 6,407,002 B1 * | 6/2002 | Lin | .................... | H01L 21/31144 257/E21.256 |
| 6,727,169 B1 * | 4/2004 | Raaijmakers | ....... | C23C 16/0272 438/622 |
| 7,074,690 B1 * | 7/2006 | Gauri | ................ | H01L 21/02164 257/E21.278 |
| 2002/0061645 A1 * | 5/2002 | Trivedi | ............. | H01L 21/76877 438/640 |
| 2003/0006441 A1 * | 1/2003 | Nakamura | ........ | H01L 21/76802 257/296 |
| 2003/0157760 A1 * | 8/2003 | Xi | ........................... | C23C 16/06 438/200 |
| 2007/0080459 A1 * | 4/2007 | Seok | ................. | H01L 21/28556 257/751 |
| 2007/0161233 A1 * | 7/2007 | Seok | ................. | H01L 21/02063 438/638 |
| 2008/0014352 A1 * | 1/2008 | Xi | ..................... | H01L 21/28562 427/255.394 |
| 2009/0148652 A1 * | 6/2009 | Carlisle | .................. | B82Y 35/00 428/80 |
| 2009/0289334 A1 * | 11/2009 | Rachmady | ........ | H01L 21/28079 257/649 |
| 2010/0144140 A1 * | 6/2010 | Chandrashekar | ..... | C23C 16/045 438/669 |
| 2010/0240212 A1 * | 9/2010 | Takahashi | ......... | H01L 21/28556 438/637 |
| 2011/0221044 A1 * | 9/2011 | Danek | ................ | H01L 21/2885 257/621 |
| 2012/0028454 A1 * | 2/2012 | Swaminathan | ........ | C23C 16/045 438/558 |
| 2012/0161218 A1 * | 6/2012 | Niitsuma | .......... | H01L 21/28061 257/296 |
| 2013/0171822 A1 * | 7/2013 | Chandrashekar | ........................... H01L 21/28556 438/675 |
| 2015/0048511 A1 * | 2/2015 | Tsai | .................. | H01L 21/76865 257/763 |
| 2015/0050807 A1 * | 2/2015 | Wu | .................... | H01L 21/28556 438/669 |
| 2015/0111374 A1 * | 4/2015 | Bao | .................. | H01L 21/30655 438/586 |
| 2015/0228491 A1 * | 8/2015 | Kang | ................ | H01L 21/28194 257/330 |
| 2015/0262939 A1 * | 9/2015 | Sakata | ............. | H01L 23/53266 257/753 |
| 2017/0170125 A1 * | 6/2017 | Furumoto | ......... | H01L 23/53266 |
| 2017/0186766 A1 * | 6/2017 | Kitao | ................. | H01L 29/66833 |
| 2017/0263611 A1 * | 9/2017 | Imamura | ........... | H01L 21/31144 |
| 2017/0271170 A1 * | 9/2017 | Omura | ............ | H01L 21/32136 |
| 2017/0283942 A1 * | 10/2017 | Suzuki | .................... | C23C 16/08 |
| 2018/0061663 A1 * | 3/2018 | Chandrashekar | ..... | C23C 16/505 |
| 2019/0074191 A1 * | 3/2019 | Nagatomo | .......... | H01L 21/0337 |
| 2019/0148225 A1 * | 5/2019 | Chen | ................. | H01L 29/41791 257/384 |
| 2019/0148402 A1 * | 5/2019 | Yoshikawa | ....... | H01L 27/11582 257/324 |
| 2019/0164969 A1 * | 5/2019 | Leib | .................. | H01L 21/76802 |

* cited by examiner

METHOD FOR PRODUCING AT LEAST ONE VIA IN A WAFER

This application claims priority under 35 U.S.C. § 119 to patent application number DE 10 2017 216 937.0, filed on Sep. 25, 2017 in Germany, the disclosure of which is incorporated herein by reference in its entirety.

BACKGROUND

The disclosure relates to a method for producing at least one via in a wafer.

The disclosure furthermore relates to a chip.

Vias are used to make electrical contact with microelectronic structures, such as semiconductor structures or the like, which consist for example of conductive and nonconductive layers arranged alternately.

A method for producing a via has been disclosed by U.S. Pat. No. 6,309,966 B1, for example. For this purpose, tungsten hexafluoride is applied to a wafer with a hole that has already been produced, and tungsten from the tungsten hexafluoride is then reduced with the aid of hydrogen or monosilane $SiH_4$ and thus deposited. The tungsten then deposits in the hole and on the surface of the wafer. Since the deposited tungsten on the surface of the wafer is undesired, said tungsten is removed by means of polishing, with the result that only the holes are filled. Such a method is shown schematically in FIGS. 1A-1C.

Figure 1A:
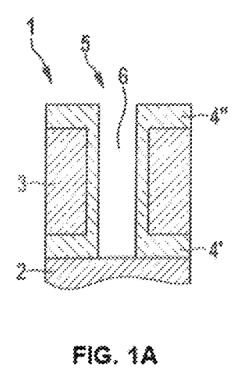
FIG. 1A shows a step of known methods for producing vias.
Figure 1B:
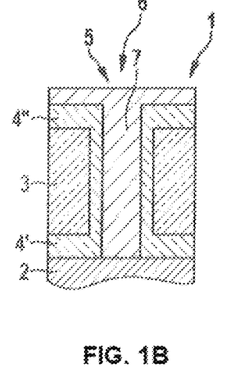
FIG. 1B shows a step of known methods for producing vias.
Figure 1C:
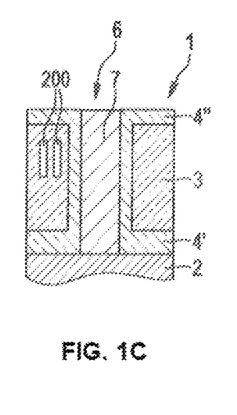
FIG. 1C shows a step of known methods for producing vias.

In order to reduce the stress caused by a fully filled tungsten via in the wafer, firstly what has been disclosed involves introducing load relieving structures into the wafer material (see FIG. 1C). Secondly what has been disclosed involves not completely filling the hole with tungsten, but rather essentially applying tungsten only in a thin layer on the inner surface of the hole (see FIG. 1D).

SUMMARY

In one embodiment, the disclosure provides a method for producing at least one via in a wafer,
comprising the following steps:
providing a wafer, comprising silicon,
producing a conductive region, in particular in the form of a conductor track, preferably composed of polycrystalline silicon, in the wafer,
producing a hole in the wafer, in such a way that the hole is fluidically at least partly connected to the conductive region and the sidewalls of the hole comprise silicon,
applying a tungsten hexafluoride-resistant protective layer, produced in particular from silicon oxide, in the region of the surface of the hole that is to be produced or has been produced, such that an opening of the hole that is to be produced or has been produced is free of a protective layer, and
applying tungsten hexafluoride to the hole and the region of the opening of the hole by means of a reducing-agent-free vapor phase deposition process, preferably in the form of a CVD process, for producing the at least one via.

In a further embodiment, the disclosure provides a chip comprising at least one via, produced by a method according to the following description.

One of the advantages achieved thereby is that the tungsten can be deposited selectively in the hole, without using a reducing agent such as hydrogen or silane. The silicon of the inner surface of the hole reacts with the tungsten hexafluoride to form volatile silicon fluoride and tungsten is deposited on the inner surface. The resulting tungsten layer in the interior of the hole, with increasing thickness, limits or restricts a further increase in the thickness of the tungsten layer on the inner side of the hole since less silicon is available as reactant or the diffusion length is increased. A further advantage is that this likewise enables the amount of tungsten deposited in the deeper region of the hole to be just as much as at the entrance, that is to say in the upper region of the hole. A further advantage is that the expensive and complex polishing process required hitherto can be obviated since the tungsten hexafluoride reacts only with the silicon, but not with the protective layer. Furthermore, one advantage is that stress is reduced without the need to produce load-relieving structures or the like in a complex manner, which moreover take up considerable space on the wafer. Furthermore, the reliability is increased since the tungsten hexafluoride can react with the material of the conductor track and enables a reliable and electrically good connection, particularly if the conductor track is produced from polycrystalline silicon.

The term "sidewall" should be understood in the broadest sense and, in particular in the description, relates to any type of inner or outer wall of a hole. The sidewalls of a hole are U-shaped, in particular.

The term "via" should be understood in the broadest sense and, in particular in the description, relates to any type of an, in particular, vertical, electrical connection between different planes of a printed circuit board, of a chip, wafer or the like. The term "via" should be understood to mean in particular a "vertical interconnect access" or a "TSV", "Through-Silicon Via".

Further features, advantages and further embodiments of the disclosure are described hereinafter or are disclosed thereby:

In accordance with one advantageous development, the hole is closed with a soft conductive material, in particular a soft metal such as aluminum or the like. One of the advantages thereof is that a closed, stress-reduced via can be produced which does not entrain any liquids. Consequently, corrosion is reduced and the lifetime is increased.

In accordance with a further advantageous development, a lateral isolation is produced for the via that is to be produced or has been produced, in particular by producing isolation trenches filled with isolation material. Consequently, an electrical isolation for the via can already be produced beforehand, for example before the hole is produced, in a simple manner.

In accordance with a further advantageous development, in the region of the opening of the hole an opening in the protective layer and/or the opening of the hole are/is rounded. In this way, the deposition of the soft material, for example of aluminum for closing the hole, can be improved since sharp edges and hence stress are avoided.

In accordance with a further advantageous development, the protective-layer-free region is formed such that it is larger than the opening of the hole. In this way, the silicon directly around the via to be produced is exposed or kept free, such that during a reducing-agent-free CVD process the tungsten hexafluoride can react with the silicon on the surface, too, and is thus likewise deposited there. The protective-layer-free region thus comprises an area comprising the area of the opening of the hole and the surroundings thereof on the surface of the wafer.

In accordance with a further advantageous development, the inner surface of the hole is roughened in order to enlarge the area of the sidewalls of the hole. Grooved sidewalls of the hole arise in this way. A larger area with the reactant silicon is thus made available to the tungsten hexafluoride during the reducing-agent-free vapor phase deposition process, which increases the reliability of the deposition and reduces the electrical resistance of the later via.

In accordance with a further advantageous development, the hole is formed in goblet-shaped fashion in cross section in the direction of the opening of the hole and/or in the direction of the conductor track. In this way, an upwardly narrowing hole can be produced, for example, which enables a more rapid closure by the soft material. A hole or via formed in goblet-shaped fashion, that is to say an upwardly widening hole, enables a better or simpler deposition of tungsten in the interior of the hole.

In accordance with a further advantageous development, the soft material is leveled at least once, in particular wherein afterward once again soft material is applied and leveled. In this regard, by way of example, after the deposition of the soft material, for example by aluminum being sputtered, the topography of the applied material can be leveled by backsputtering. In order to increase the layer thickness, aluminum can then once again be sputtered and can be leveled again in order to increase the thickness of the closure again.

In accordance with a further advantageous development, the hole is produced in circular, rectangular or hexagonal form in cross section. A circular embodiment of the vias enables vias with little stress, whereas rectangular embodiments of the vias minimize an undesired introduction of foreign material during the reducing-agent-free vapor phase deposition process. Overall the flexibility of vias is significantly increased as a result, since, by way of example, the embodiments can also be used to reduce the electrical resistance and/or to optimize the deposition of the tungsten during the reducing-agent-free vapor phase deposition process.

In accordance with a further advantageous development, a plurality of vias are arranged, which are conductively connected to one another. As a result, the resistance of the structure of the plurality of vias can be significantly reduced overall.

In accordance with a further advantageous development, the plurality of vias are electrically contactable by means of a common contact region. Electrical contacting is thus made possible in a simple manner.

Further important features and advantages of the disclosure are evident from the drawings and from the associated description of figures with reference to the drawings.

It goes without saying that the features mentioned above and those yet to be explained below can be used not only in the combination respectively indicated, but also in other combinations or by themselves, without departing from the scope of the present disclosure.

Preferred implementations and embodiments of the disclosure are illustrated in the drawings and are explained in greater detail in the following description, wherein identical reference signs refer to identical or similar or functionally identical component parts or elements.

BRIEF DESCRIPTION OF THE DRAWINGS

Here in schematic form

DETAILED DESCRIPTION

FIGS. 1A, 1B, 1C, and 1D show steps of known methods for producing vias.

In detail, FIG. 1A shows a conductive layer 2 in the lower region, said conductive layer being accessible by way of a hole 6. Isolation material 4", 4' has been deposited on the top side of the conductive layer 2 in the region of the opening 5 of the hole 6 and also in the interior of the hole 6 and on the surface. In this case, the hole 6 has been produced by means of an etching process. Proceeding therefrom, the wafer 1 is subjected to a tungsten hexafluoride CVD process, with the result that tungsten 7 is deposited both in the hole 6 and on the surface of the isolation material 4" with the aid of hydrogen or monosilane $SiH_4$. Afterward, in accordance with FIG. 1C, the tungsten on the surface is removed by polishing, with the result that only the hole 6 is filled with tungsten 7.

Figure 1D:
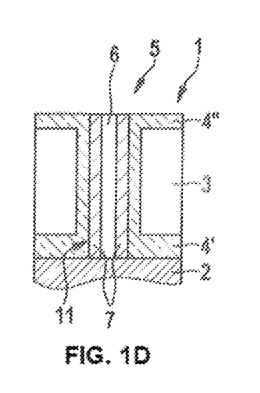
FIG. 1D shows a step of known methods for producing vias.

In order to minimize stress of the fully filled hole, load-relieving structures 200 are arranged in the upper region, as shown in FIG. 1C, or else the tungsten 7 is applied only on the sidewalls 11 of the hole 6, such that a free region remains in the center of the hole 6, as shown in FIG. 1D.

FIGS. 2A-2E show steps of a method in accordance with one embodiment of the present disclosure.

Figure 2A:
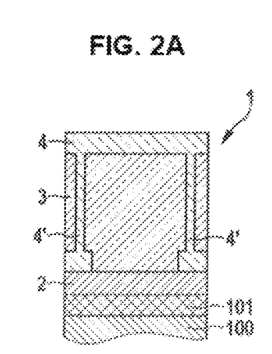
FIG. 2A shows a step of a method in accordance with one embodiment of the present disclosure.

In a first step in accordance with FIG. 2A, a wafer 1 is produced by a procedure in which an interlayer 101 is applied on a substrate 100 and a conductor track 2 is in turn applied on said interlayer. Silicon 3 is applied on said conductor track 2, wherein, for later isolation of the via, isolation trenches are etched into the silicon 3 and are filled with silicon oxide as isolation material 4'. They are arranged on the left and right of the later via 12 in FIG. 2A. Isolation material in the form of silicon oxide as a tungsten-hexafluoride-resistant protective layer 4 is likewise applied on the surface of the silicon.

Figure 2B:
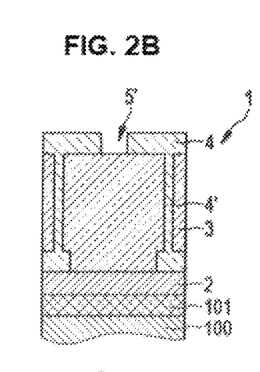
FIG. 2B shows a step of a method in accordance with one embodiment of the present disclosure.

A further step in accordance with FIG. 2B involves producing an opening 5' in the protective layer 4 composed of silicon oxide at the surface of the wafer 1 for the later via 12.

Figure 2C:
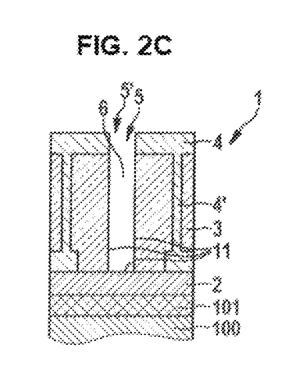
FIG. 2C shows a step of a method in accordance with one embodiment of the present disclosure.

In a further step in accordance with FIG. 2C, by way of said opening 5' a hole 6 with opening 5 is then produced in the silicon 3, for example by means of an etching process, such that an access to the conductor track 2 is produced.

Figure 2D:
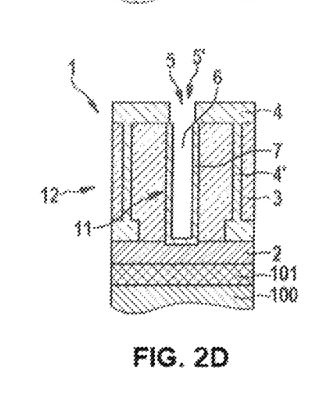
FIG. 2D shows a step of a method in accordance with one embodiment of the present disclosure.

In a further step in accordance with FIG. 2D, tungsten hexafluoride is then applied to the wafer 1 by means of a reducing-agent-free CVD process, which tungsten hexafluoride reacts with the silicon 3 in the sidewalls 11 of the hole 6. In this way, tungsten 7 is deposited selectively, such that the hole 6 is not completely filled with tungsten 7. In other words, the sidewalls 11 of the hole 6 have tungsten 7 in a certain layer thickness, wherein a free space remains in the interior of the hole 6. In this case, the layer thickness overall essentially depends on the time during which the tungsten hexafluoride acts on the silicon, and an already present thickness of the deposited tungsten layer.

In accordance with FIG. 2E, aluminum 8 or a similarly soft metal is subsequently applied, for example by sputtering, which closes the via 12 by means of a closure 9 and contacts the tungsten 7 in the contact region 10. FIG. 2F, shows the state of the wafer 1 or the via 12 in accordance with FIG. 2D in plan view.

Figure 3A:
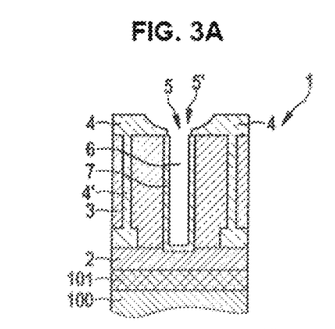
FIG. 3A shows a step of a method in accordance with one embodiment of the present disclosure.
Figures 3B, 3C:
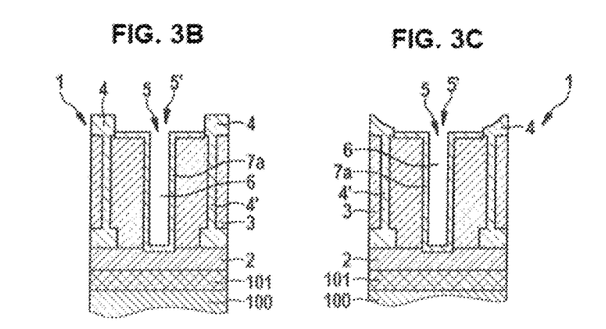
FIG. 3B shows a step of a method in accordance with one embodiment of the present disclosure.
FIG. 3C shows a step of a method in accordance with one embodiment of the present disclosure.

FIGS. 3A-3C show steps of a method in accordance with one embodiment of the present disclosure.

Figure 3D:
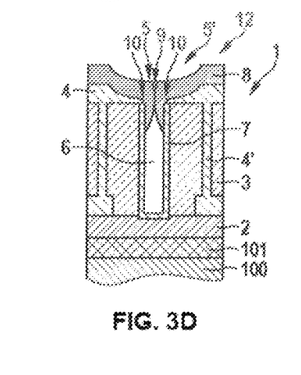
FIG. 3D shows a step of a method in accordance with one embodiment of the present disclosure.
Figure 3E:
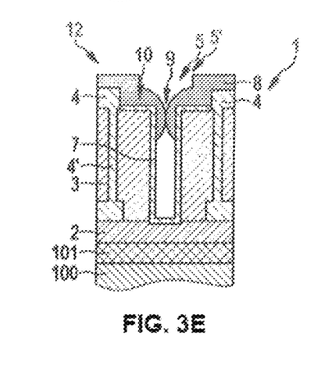
FIG. 3E shows a step of a method in accordance with one embodiment of the present disclosure.
Figure 3F:
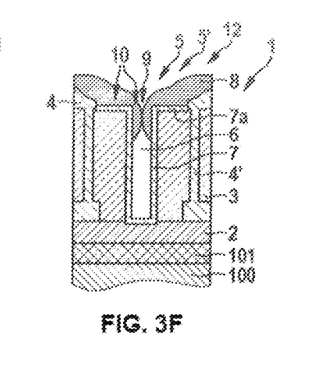
FIG. 3F shows a step of a method in accordance with one embodiment of the present disclosure.

In FIGS. 3A-3C, the wafer 1 is shown before the closure of the hole 6 with aluminum, and in FIGS. 3D-3F, after a closure of the hole 6 with aluminum 8.

In detail, in FIG. 3A, the opening 5' in the protective layer 4, here in the form of an oxide layer, for access in respect of the hole 6 is formed in rounded fashion in order to improve the aluminum deposition. FIG. 3d, then shows the state of the wafer 1 after the aluminum deposition for the closure 9 of the hole 6. By virtue of the rounded formation of the opening 5' of the protective layer 4, more aluminum is deposited in the contact region 10 with respect to the tungsten layer 7 in the hole 6, with the result that a better electrical contacting of the tungsten layer 7 is effected. In this case, the externally applied aluminum layer 8 substantially follows the course of the rounded opening 5' of the protective layer 4.

In FIG. 3B, the opening 5' of the protective layer 4 is now formed such that it is larger than the diameter of the hole 6. In other words, a partial region around the opening of the hole 6 is free of a protective layer, that is to say that this region now has silicon at its surface just like the inner side of the hole 6, which silicon is available as a reactant for the tungsten hexafluoride. If the wafer 1 is then subjected to the reducing-agent-free tungsten hexafluoride CVD process, tungsten 7 is deposited not just on the inner surface, viz. the sidewalls 11 of the hole 6, in accordance with the above explanations, but likewise on the surface in the surroundings of the hole 6, that is to say in the region that is free of a protective layer. In this way, the linking of the via can be improved, which is illustrated in FIG. 3E. The contact region 10, that is to say the region in which aluminum 8 and tungsten 7 are directly connected to one another, is significantly larger than that in FIGS. 3A and 3D.

FIGS. 3C and 3F then essentially shows a combination of the embodiments from FIGS. 3A and 3D and FIGS. 3B and 3E. In this case, a part of the protective layer 4 is removed in the surroundings of the hole 6 at the surface and moreover the protective layer 4 is formed in rounded fashion in the direction of the region that is free of a protective layer. FIG. 3F then shows an improved aluminum deposition with at the same time an improvement of the linking of the via by virtue of the fact that the contact region 10 has a correspondingly large area.

FIGS. 4A-4D show various embodiments of the hole, produced by methods in accordance with embodiments of the present disclosure.

Figure 4A:
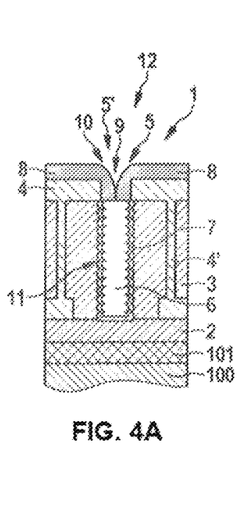
FIG. 4A shows an embodiment of the hole, produced by methods in accordance with embodiments of the present disclosure.

In FIG. 4A, the inner surface or the sidewalls 11 of the hole 6 is or are roughened, which overall leads to a higher inner surface area of the hole 6. The groovelike embodiment of the sidewalls 11 enlarges the effective area for silicon 3 with which the tungsten hexafluoride can react in the reducing-agent-free CVD process.

Figure 4B:
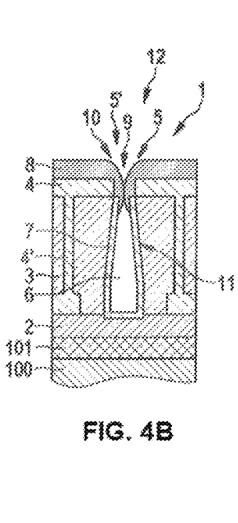
FIG. 4B shows an embodiment of the hole, produced by methods in accordance with embodiments of the present disclosure.

FIG. 4B shows a narrowing hole 6, such that the diameter of the hole 6 tapers toward the opening 5 of the hole 6. In other words, the diameter of the hole 6 in the direction of the conductor tracks 2 is greater than the diameter of the opening 5 of the hole 6. By virtue of the smaller embodiment of the opening 5 of the hole 6, the hole 6 can be closed with aluminum 8 in a simpler manner.

Figure 4C:
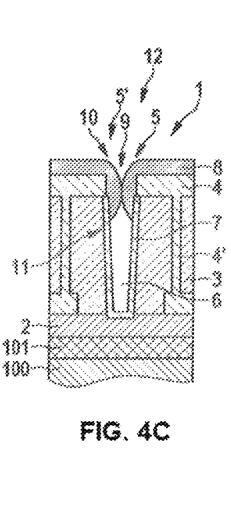
FIG. 4C shows an embodiment of the hole, produced by methods in accordance with embodiments of the present disclosure.

FIG. 4C then shows a goblet-shaped embodiment of the hole 6. The diameter of the hole 6 proceeding from the conductor tracks 2 becomes larger in the direction of the surface of the wafer 1. In this way it is possible to improve the tungsten deposition during the reducing-agent-free CVD process.

Figure 4D:
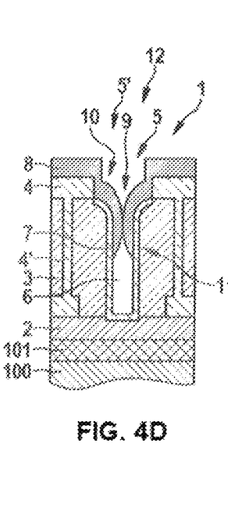
FIG. 4D shows an embodiment of the hole, produced by methods in accordance with embodiments of the present disclosure.

In FIG. 4D, the region of the opening 5 of the hole 6 is then formed in rounded fashion, which likewise leads to a rounding of the tungsten layer 7 in the provided contact region 10 of the opening 5 of the hole 6. A simple contacting of the tungsten layer 7 by means of the aluminum layer 8 is possible in this way.

Figure 5:
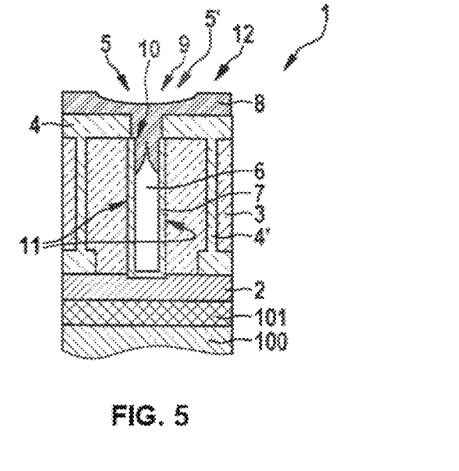
FIG. 5 shows a via, produced by a method in accordance with one embodiment of the present disclosure.

FIG. 5 shows a via, produced by a method in accordance with one embodiment of the present disclosure.

Figure 2E:
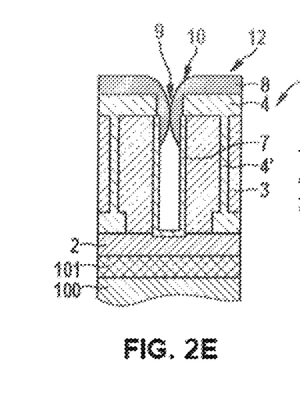
FIG. 2E shows a step of a method in accordance with one embodiment of the present disclosure.
Figure 2F:
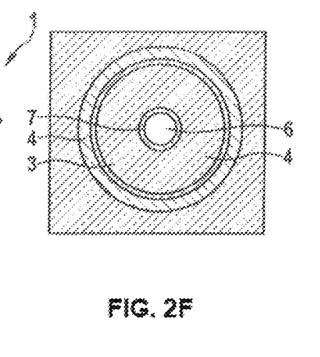
FIG. 2F shows a step of a method in accordance with one embodiment of the present disclosure.

In detail, FIG. 5 essentially shows a wafer 1 or via 12 in accordance with FIGS. 2E and 2F. In contrast to FIGS. 2E and 2F, in FIG. 5 the surface of the aluminum has been subjected to atomic or ion bombardment, which leads to leveling or rounding of the flanks of the closure 9. In addition, it is possible to deposit aluminum 8 once again and to level it once again, such that a substantially planar aluminum layer 8 for closing the hole 6 is produced.

Figure 6A:
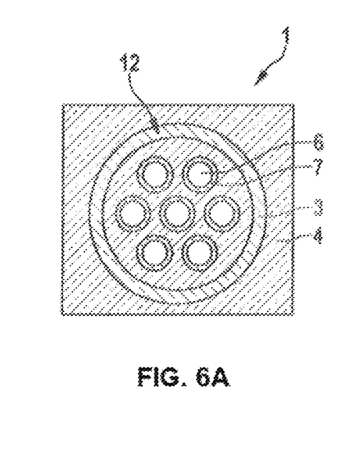
FIG. 6A shows a plan view and sectional illustration of a plurality of vias, produced by a method in accordance with one embodiment of the present disclosure.
Figure 6B:
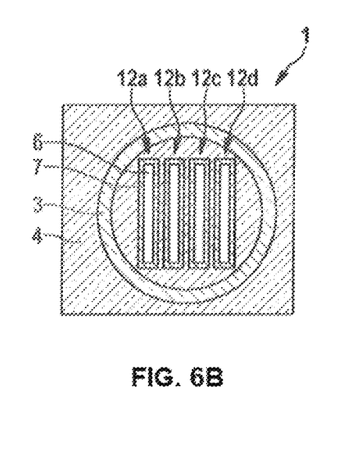
FIG. 6B shows a plan view and sectional illustration of a plurality of vias, produced by a method in accordance with one embodiment of the present disclosure.
Figure 6C:
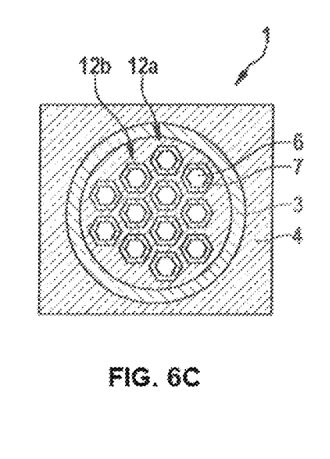
FIG. 6C shows a plan view and sectional illustration of a plurality of vias, produced by a method in accordance with one embodiment of the present disclosure.
Figure 6D:
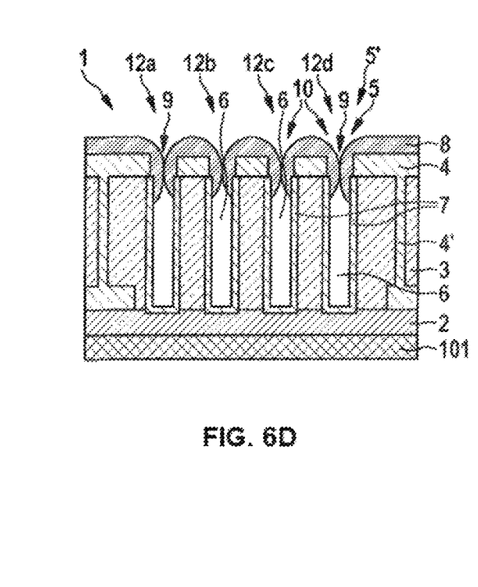
FIG. 6D shows a sectional illustration of a via, produced by a method in accordance with one embodiment of the present disclosure.
Figure 6E:
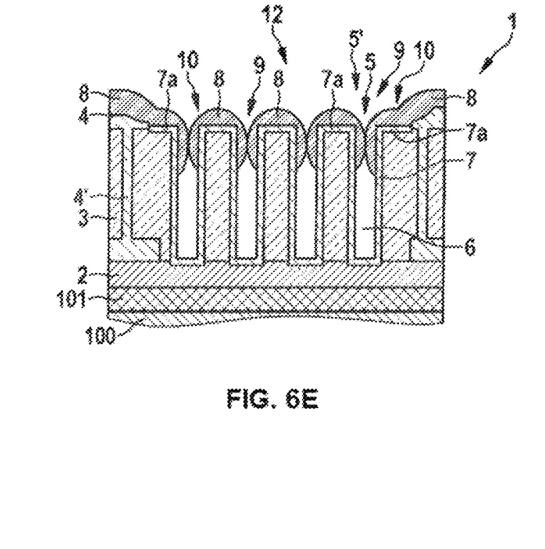
FIG. 6E shows a sectional illustration of a via, produced by a method in accordance with one embodiment of the present disclosure.

FIGS. 6A-6C show various plan views of a plurality of vias with different hole geometries of the vias, and FIGS. 6D and 6E show sectional illustrations of exemplary embodiments having a plurality of vias, produced by a method in accordance with one embodiment of the present disclosure.

In detail, FIG. 6A shows a hexagonal arrangement of vias 12, wherein each via 12 is formed in substantially cylindrical fashion. FIG. 6B shows rectangular vias 12a, 12b, 12c, 12d, which are arranged parallel along their longitudinal side. A plurality of vias 12a, 12b, . . . having substantially a hexagonal cross section are in turn arranged in FIG. 6C. In each of FIGS. 6A-6C, the individual vias 12a, 12b, . . . are arranged as close together as possible in order to be able to utilize the area of the wafer 1 as effectively as possible.

FIG. 6D then shows a sectional view of the rectangular vias 12a, 12b, 12c, 12d. The vias 12a, 12b, 12c, 12d are electrically connected by way of the aluminum layer 8, but not by way of the tungsten layer 7. The last-mentioned connection of the individual vias 12a, 12b, 12c, 12d is shown in FIG. 6E. For this purpose, the protective layer 4 is removed between the rectangular vias 12a, 12b, 12c, 12d, such that, during the reducing-agent-free tungsten hexafluoride CVD process, tungsten 7 can also deposit on the respective top side of the substrate between the vias 12a, 12b, 12c, 12d and the individual vias can thus be connected in a type of meander structure in cross section. Furthermore, they are electrically connected to one another by virtue of their respective closures 9 by means of aluminum 8. Overall, a particularly reliable contacting of the entire structure of the vias 12a, 12b, 12c, . . . is thus achieved.

Figure 7A:
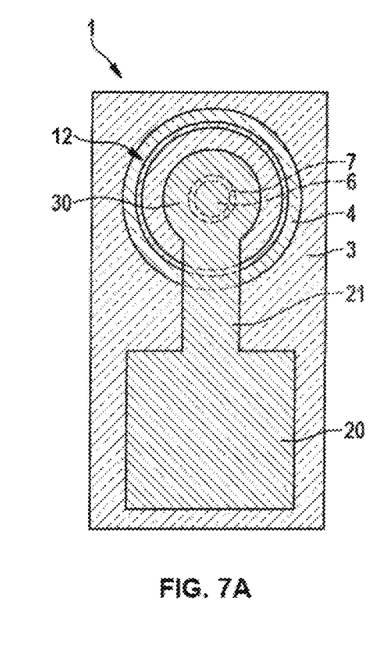
FIG. 7A shows contactings of vias, produced by a method in accordance with one embodiment of the present disclosure.
Figure 7B:
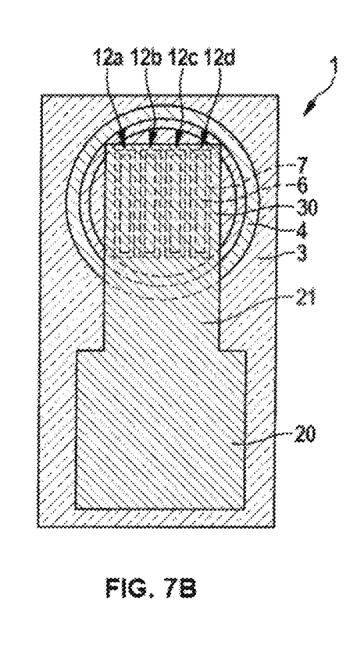
FIG. 7B shows contactings of vias, produced by a method in accordance with one embodiment of the present disclosure.

FIGS. 7A, 7B show different contactings of vias, produced by a method in accordance with one embodiment of the present disclosure.

FIG. 7A shows the contacting of a single cylindrical via 12. For this purpose, a contacting 30 for the via 12 is arranged, which is connected to a contact pad 20 by way of a conductive connection 21. In FIG. 7B, the vias 12a, 12b, 12c, 12d in accordance with FIG. 6B are then electrically contactable by way of a common contacting 30, a conductive connection 21 and a corresponding contact pad 20.

To summarize, at least one embodiment has at least one of the following advantages:
no expensive polishing process necessary
reliable and electrically good connection
reduction of stress in the wafer
closed via, which prevents ingress of liquids
high precision of the thickness of the tungsten layer during the deposition
high flexibility with regard to the shape of the vias
high reliability, in particular less corrosion Although the present disclosure has been described on the basis of preferred exemplary embodiments, it is not restricted thereto, but rather can be modified in diverse ways.

What is claimed is:

1. A method for producing at least one via in a wafer, the method comprising:
providing a wafer, comprising silicon;
producing a conductive region, formed as a conductor track, in the wafer;
producing a hole in the wafer, such that the hole is fluidically at least partly connected to the conductive region and the sidewalls of the hole comprise silicon;
applying a tungsten hexafluoride-resistant protective layer, produced from silicon oxide, in a region of the surface of the hole that is to be produced or has been produced, such that an opening of the hole that is to be produced or has been produced is free of a protective layer, and
applying tungsten hexafluoride to the hole and a region of the opening of the hole by a reducing-agent-free vapor phase deposition process for producing the at least one via.

2. The method according to claim 1, wherein the hole is closed with a soft conductive material.

3. The method according to claim 1, wherein a lateral isolation is produced for the via that is to be produced or has been produced by producing isolation trenches filled with isolation material.

4. The method according to claim 1, wherein in the region of the opening of the hole at least one of an opening in the protective layer and the opening of the hole is rounded.

5. The method according to claim 1, wherein the protective-layer-free region is produced such that it is larger than the opening of the hole.

6. The method according to claim 1, wherein the inner surface of the hole is roughened in order to enlarge the area of the sidewalls of the hole.

7. The method according to claim 1, wherein the hole is formed in goblet-shaped fashion in cross section in the direction of the opening of the hole and/or in the direction of the conductor track.

8. The method according to claim 2, wherein the soft material is leveled at least once.

9. The method according to claim 1, wherein the hole is produced in circular, rectangular or hexagonal form in cross section.

10. A chip comprising at least one via, produced by the method according to claim 1.

11. The chip according to claim 10, wherein a plurality of vias are arranged, which are conductively connected to one another.

12. The chip according to claim 10, wherein the plurality of vias are electrically contactable by a common contact region.

13. The method according to claim 1, wherein the conductive region is composed of polycrystalline silicon.

14. The method according to claim 1, wherein the reducing-agent-free vapor phase deposition process is a CVD process.

15. The method according to claim 2, wherein the soft conductive material is a soft metal.

16. The method according to claim 15, wherein the soft metal is aluminum.

17. The method according to claim 8, wherein afterward once again soft material is applied and leveled.

* * * * *